United States Patent [19]
Bien

[11] Patent Number: 5,465,415
[45] Date of Patent: Nov. 7, 1995

[54] EVEN ORDER TERM MIXER

[75] Inventor: David E. Bien, Sunnyvale, Calif.

[73] Assignee: National Semiconductor Corporation, Santa Clara, Calif.

[21] Appl. No.: 926,599

[22] Filed: Aug. 6, 1992

[51] Int. Cl.[6] .................................................... H04B 1/26
[52] U.S. Cl. ........................... 455/326; 455/333; 455/318
[58] Field of Search .................................... 455/208, 209, 455/318, 319, 326, 323, 333; 307/529

[56] References Cited

U.S. PATENT DOCUMENTS

| | | | |
|---|---|---|---|
| 4,658,440 | 4/1987 | Pavio et al. | 455/333 X |
| 4,704,738 | 11/1987 | Graziadie et al. | 455/333 X |
| 4,910,801 | 3/1990 | Anzini et al. | 455/326 |
| 5,083,050 | 1/1992 | Vasile | 455/333 X |

FOREIGN PATENT DOCUMENTS 0416889  3/1991  European Pat. Off. ......... H03D 7/14

OTHER PUBLICATIONS

D. C. Surana & J. G. Gardiner, "Crosscoupled Transistor Mixer", Proceedings of the IEEE, vol. 117, No. 11, Nov. 1970, pp. 2105–2108.

Primary Examiner—Edward F. Urban
Attorney, Agent, or Firm—Limbach & Limbach; H. Donald Nelson; Richard J. Roddy

[57] ABSTRACT

An even order term mixer for mixing two ac input signals includes two bipolar junction transistors (each having a base-emitter junction forward bias threshold voltage $V_T$) with mutually connected collectors and cross-coupled bases and emitters. Each transistor receives a dc emitter bias current $I_E$ and both transistors each receive two single-ended ac input signals $V_1$ ($=|V_1|.\cos[2\pi f_1 t]$) and $V_2$ ($=|V_2|.\cos[2\pi f_2 t]$). Each transistor mixes its two ac input signals $V_1$, $V_2$ and produces a collector current representing the result thereof. The two collector currents sum at the interconnected collectors and produce across a resistor $R_C$ also connected thereto an ac output voltage $V_O$ having even order terms and virtually no odd order terms of the mixing products (e.g. sum of and difference between the frequencies) of the two ac input signals.

24 Claims, 10 Drawing Sheets (AC SIGNAL MODEL)

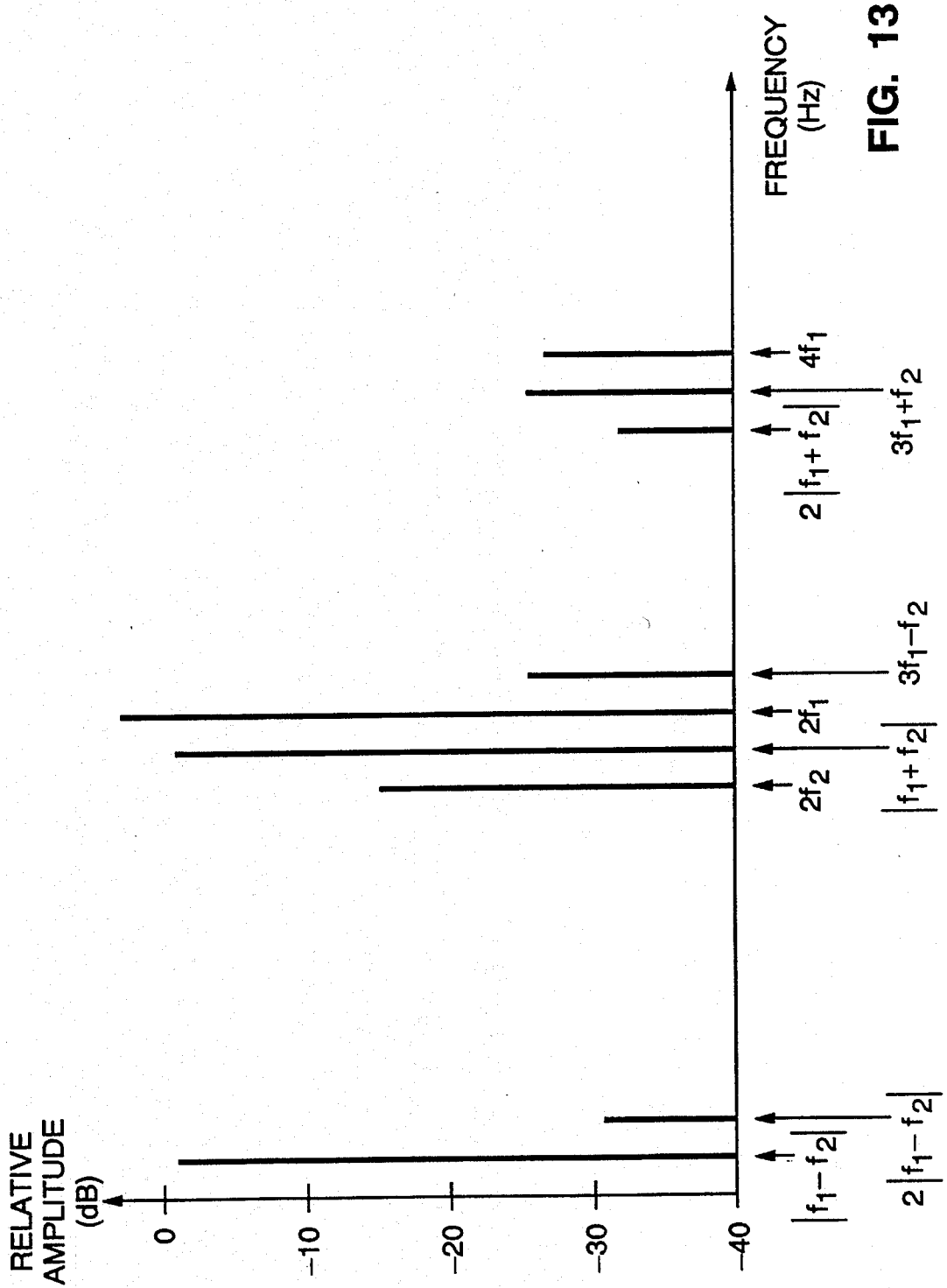

EVEN ORDER TERM MIXER

BACKGROUND OF THE INVENTION

1. Field of the Invention

The present invention relates to analog signal mixers, and in particular, to analog signal mixers in which the harmonic content of the output signal is limited.

2. Description of the Related Art

An important component used in virtually all wireless transmission and reception systems is an analog signal mixer. A mixer is variously used to modulate, demodulate and frequency-translate signals. A mixer can be used to up-convert a signal, i.e. translate a signal's frequency up, with or without modulation, and also to down-convert i.e. translate a signal's frequency down, with or without demodulation.

Referring to FIG. 1, a common conventional mixer configuration is that of a multiplier mixer, which can be realized in a number of different ways. A multiplier mixer typically receives a local oscillator ("LO") signal $V_1$ and a radio frequency ("RF") signal $V_2$, and multiplies them to produce an output signal $V_0$. The magnitude and frequency of the output signal $V_0$ are dependent upon the respective magnitudes and frequencies of the input signals $V_1$ and $V_2$. This dependence can be represented as follows:

$$V_O = |V_1| \cdot \cos(2\pi f_1 t) \cdot |V_2|\cos(2\pi f_2 t)$$
$$= \frac{|V_1||V_2|}{2} \cdot \{\cos[2\pi(f_1-f_2)t] + \cos[2\pi(f_1+f_2)t]\}$$

where:

$V_O$=output signal voltage $|V_1|$=magnitude of carrier signal voltage $f_1$=frequency of carrier signal in Hertz $|V_2|$=magnitude of modulating signal voltage $f_2$=frequency of modulating signal in Hertz t=time in seconds cos[x]=cosine function of "x"

Referring to FIG. 2, one conventional mixer design is that of a Gilbert multiplier, sometimes referred to as a quad mixer. This type of mixer receives a dc bias voltage $V_{CC}$ via two resistors $R_C$ and a dc bias current $I_{EE}$, as shown. The LO signal $V_1$ is applied differentially to parallel differential amplifiers, each comprising two matched transistors. The RF signal $V_2$ is applied differentially to another differential amplifier, also comprising two matched transistors as shown. The output signal $V_0$, taken across the outputs of the parallel differential amplifiers, as shown, is a function of the two input signals $V_1$ and $V_1$, as follows:

$$V_0 = I_{EE}R_C \cdot \tanh[V_1/(2V_T)] \cdot \tanh[V_2/(2V_T)]$$

where:

$V_0$=output signal voltage $I_{EE}$=emitters' dc supply current in amperes $R_C$=collectors' output resistor in ohms $V_1=|V_1|\cdot\cos(2\pi f_1 t)$ $V_T$=transistor base-emitter junction forward bias threshold voltage ($\approx$25 millivolts)

$V_2=|V_2|\cdot\cos(2\pi f_2 t)$ tanh[x]=hyperbolic tangent function of "x"

Advantages of a Gilbert multiplier mixer included conversion gain, direct multiplication of the input signals and good compatibility with monolithic silicon integration techniques. However, disadvantages include "noisy" operation, distortion at signal levels above $2V_T$ (unless degeneration is used) and poor operation under low voltage conditions, e.g. with $V_{CC}$ below three volts.

Referring to FIG. 3, another conventional mixer design uses the non-linear device characteristics of a semiconductor such as a bipolar junction transistor ("BJT"). A BJT in a common emitter configuration with collector $V_{CC}$ and base $V_{BB}$ bias voltages, receives its LO signal $V_1$ and RF signal $V_2$, summed together, at its base. Due to the inherent non-linearity of the transistor's operating characteristics, the output voltage $V_0$ is a function of the input signals $V_1$ and $V_2$, as follows:

$$\begin{aligned}V_O &= V_{CC} - I_C R_C \\ &= V_{CC} - R_C I_S e^X \\ &= V_{CC} - R_C I_S \cdot \left[1 + X + \frac{X^2}{2!} + \frac{X^3}{3!} + \ldots\right] \\ &= K_0 + K_1(V_1+V_2) + K_2(V_1+V_2)^2 + \\ &\quad K_3(V_1+V_2)^3 + \ldots\end{aligned}$$

where:

$V_{CC}$=dc supply voltage (to collector)

$I_C$=collector current in amperes $I_S$=BJT saturation current in amperes $$X = \frac{V_{BB} + V_1 + V_2}{V_T}$$

$V_{BB}$=dc supply voltage (to base)

$K_C$=scalar constant, where $C \in \{0, 1, 2, \ldots\}$ n!=(n) (n-1) (n-2) ... (1), where $n \in \{1,2,3,\ldots\}$ Advantages of a "non-linear device" mixer include conversion gain, simplicity of design and good performance with respect to noise. However, a major disadvantage is the generation of undesired frequency terms, or harmonics, namely signal energy at frequency multiples of the mixing products of the input signals (e.g. signal energy at frequency multiples of the input signal frequencies, as well as combinations of multiples of, sums of and differences between the input signal frequencies).

Referring to FIG. 4, another conventional mixer design is a diode ring mixer. A ring of four diodes (or sometimes eight diodes) are connected in a bridge configuration to the center-tapped secondary windings of two transformers, as shown. The LO signal $V_1$ and RF signal $V_2$ are applied to the primary windings of the transformers, and the output signal $V_0$ is taken from the center tap of one of the transformers, as shown. Similar to the non-linear device mixer discussed above, the output signal $V_0$ is dependent upon the two input signals $V_1$ and $V_2$.

Advantages of a diode ring mixer include good performance with respect to noise, and a wide frequency range of use (e.g. up to many gigahertz). However, disadvantages include the need for a highlevel LO signal $V_1$ and the need for transformers (or hybrid couplers) which thereby renders this design poorly suited to monolithic silicon integration techniques.

Accordingly, it would be desirable to have an improved mixer design which combines more of the advantages with fewer of the disadvantages of the foregoing conventional mixer designs.

SUMMARY OF THE INVENTION

A mixer in accordance with the present invention receives and mixes ac input signals to provide an ac output signal which includes even and odd order terms of the mixing products of the input signals. The output signal energy at each of the even order terms is greater than the output signal energy at adjacent ones of the odd order terms. A first mixing element receives and mixes the ac input signals to provide a first ac mixed signal. A second mixing element receives and mixes the ac input signals to provide a second ac mixed signal. A combining element coupled to the first and second mixing elements receives and combines the first and second ac mixed signals to provide an ac output signal. The ac output signal includes even and odd order terms of mixing products of the ac input signals, wherein each of the even order terms is greater in magnitude than adjacent ones of the odd order terms.

In a preferred embodiment of the present invention, each of the first and second mixing elements includes a transistor with two input ports and an output port. One input port receives one of the ac input signals, and the other input port receives another ac input signal via a coupling impedance. The two output ports provide the first and second ac mixed signals to a substantially nonreactive impedance (e.g. resistor) for combining therein to provide the ac output signal.

In an alternative preferred embodiment of the present invention, each of the first and second mixing elements includes two mutually coupled transistors, each of which has an input port and one of which has an output port. One input port receives one of the ac input signals, the other input port receives another ac input signal, and the output port produces one of the ac mixed signals. The combining element includes a resistor which receives and combines the ac mixed signals to produce the ac output signal.

A mixer having a circuit topology in accordance with a preferred embodiment of the present invention advantageously has input signal ports having input impedances which closely approximate the typical characteristic impedances of most video, radio frequency ("RF") and microwave systems, and therefore interfaces well with typical, standard video, RF and microwave circuits, equipment and instruments.

These and other features and advantages of the present invention will be understood upon consideration of the following detailed description of the invention and the accompanying drawings.

BRIEF DESCRIPTION OF THE DRAWINGS

FIG. 13 illustrates the frequency content of the output signal of a mixer in accordance with the present invention.

DETAILED DESCRIPTION OF THE INVENTION

Figure 1:
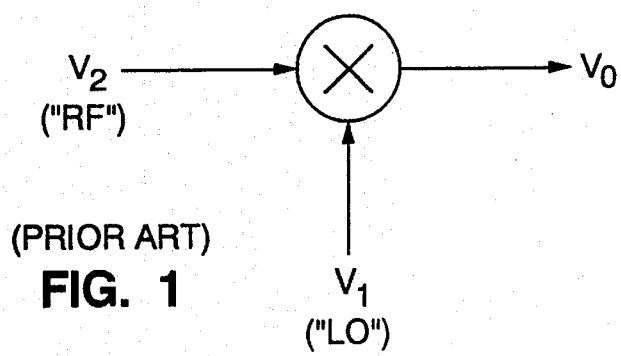
FIG. 1 illustrates a conventional functional block diagram for a multiplier mixer.
Figure 2:
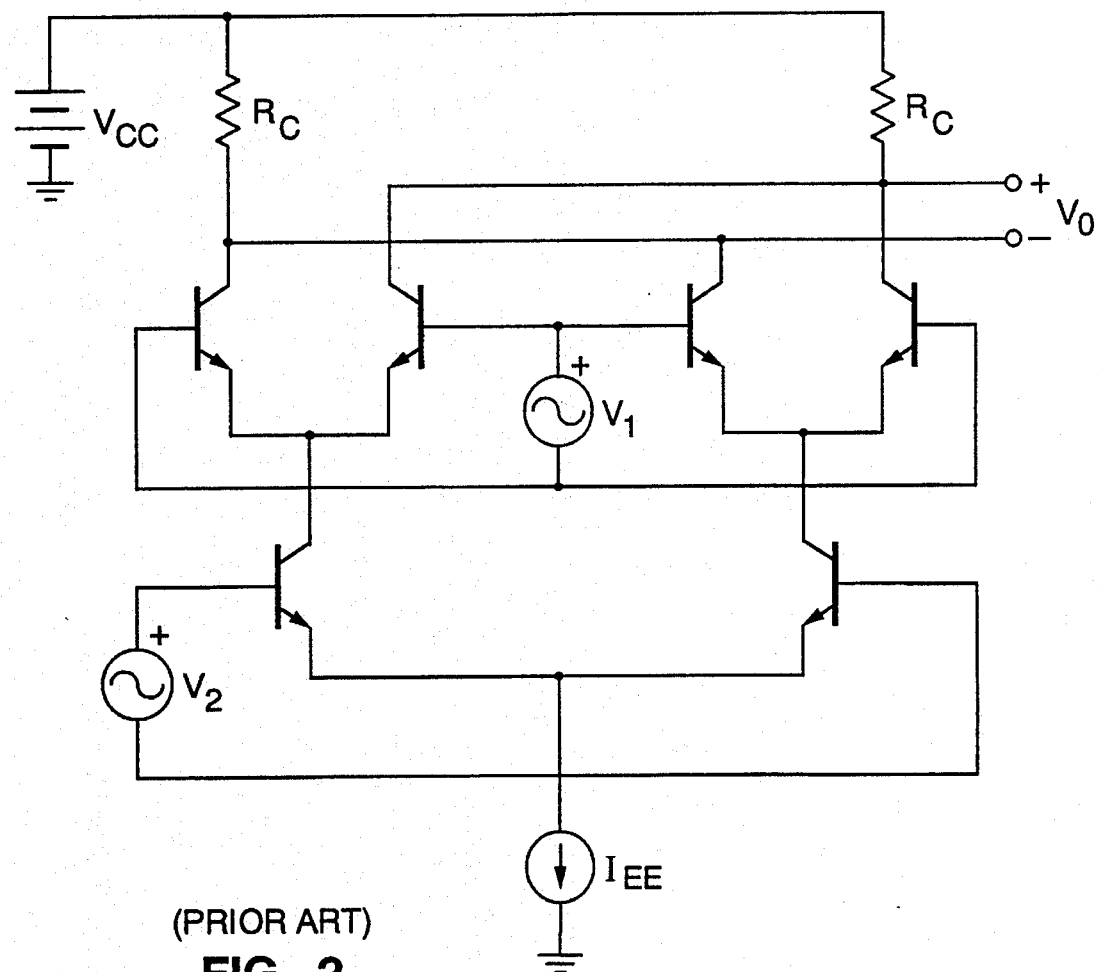
FIG. 2 is a schematic diagram of a conventional Gilbert multiplier mixer circuit.
Figure 3:
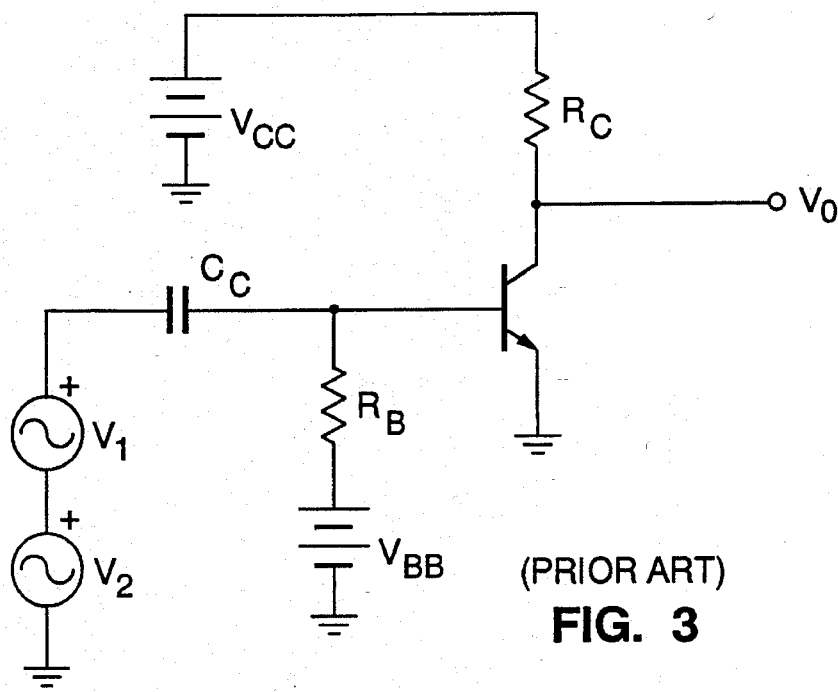
FIG. 3 is a schematic diagram of a conventional nonlinear device mixer circuit.
Figure 4:
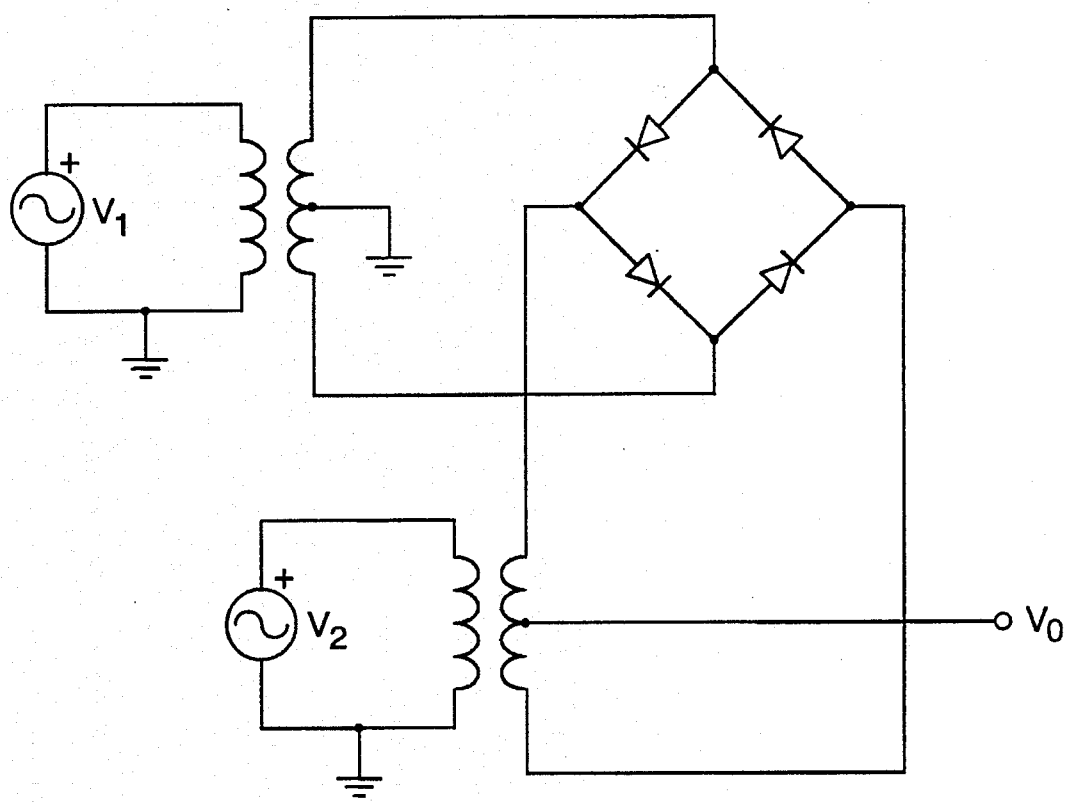
FIG. 4 is a schematic diagram of a conventional diode ring mixer circuit.
Figure 5:
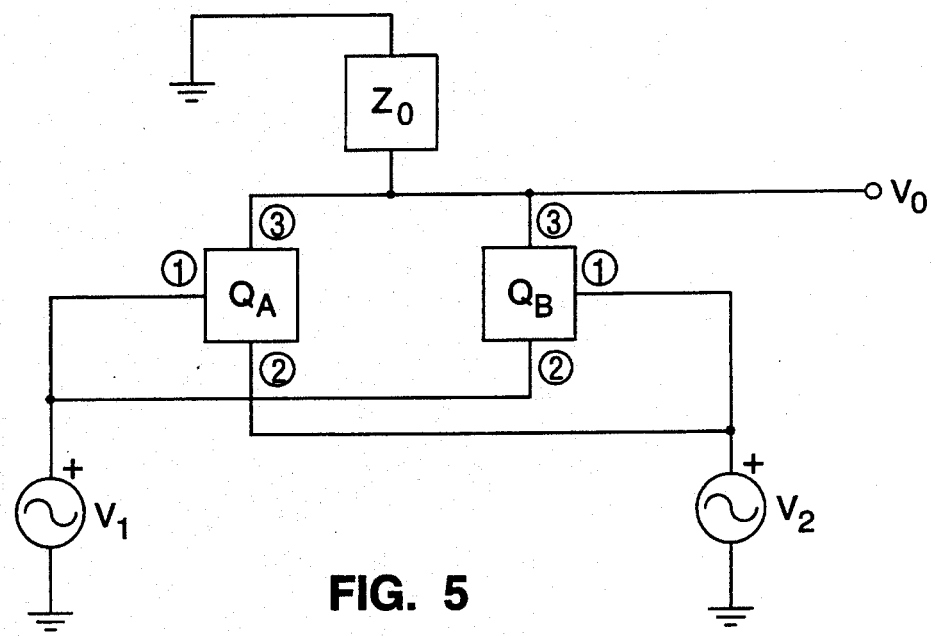
FIG. 5 is a block diagram of an ac circuit model of a mixer in accordance with the present invention.

Referring to FIG. 5, a mixer in accordance with the present invention can be modeled as shown. Two transistors $Q_A$ and $Q_B$ each receive two ac input signals from two ac signal sources $V_1$ and $V_2$. The transistors $Q_A$ and $Q_B$ mix their respective ac input signals and produce two ac mixed signals which are combined in a load, or output, impedance $Z_0$ to provide an output voltage $V_0$.

Figure 6A:
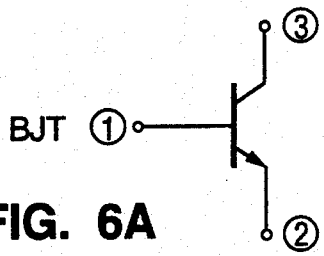
FIGS. 6A, 6B, 6C and 6D illustrate the terminal configurations for transistors which can be used in a mixer in accordance with the present invention.
Figure 6B:
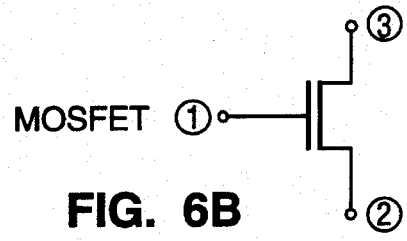
Figure 6C:
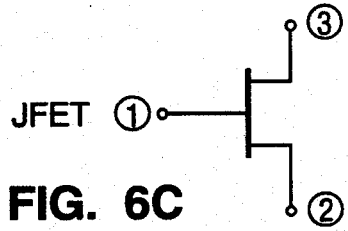
Figure 6D:
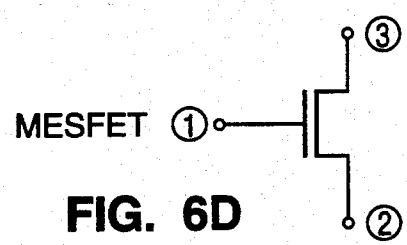
Figure 7:
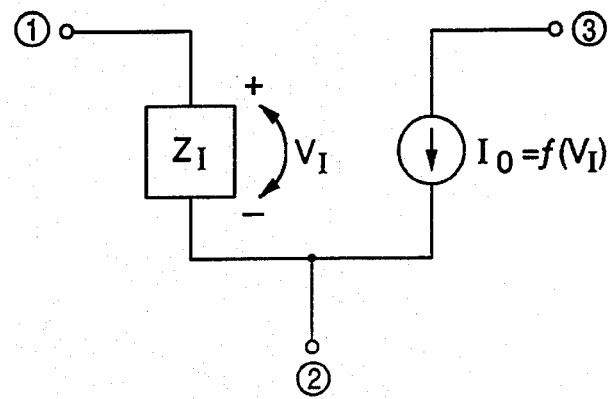
FIG. 7 illustrates a general ac signal model of a transistor.

Referring to FIGS. 6A, 6B, 6C and 6D, the transistors $Q_A$ and $Q_B$ can selectively be of several types: bipolar junction transistors ("BJTs"; FIG. 6A); metal oxide semiconductor field-effect transistors ("MOSFETs"; FIG. 6B); junction field-effect transistors ("JFETs"; FIG. 6C); or Schottky Barrier Gate field-effect transistors ("MESFETs"; FIG. 6D); with their terminal connections as shown. of which transistor type is used, each transistor can be modeled as shown in FIG. 7. In accordance with this model, each transistor has an input impedance $Z_I$ across which an input voltage $V_I$ is applied, and an output current generator producing an output current $I_0$ which is a function of the input voltage $V_I$, i.e. $I_0=f(V_I)$. For the foregoing transistor types, this relationship between the output current $I_0$ and the input voltage $V_I$ can be expressed as follows:

BJT: $I_0=I_S \cdot \exp[V_I/V_{TB}]$

MOSFET: $I_0=B(W/L)(V_I-V_{TM})^2$

JFET: $I_0=I_{DSS}(1-V_I/V_{TJ})^2$

MESFET: $I_0=I_{DSM}(1-V_I/V_{PM})^2$ where:

$I_S$=BJT saturation current in amperes $I_{DSS}$=JFET drain-to-source current with gate shorted to source $I_{DSM}$=MESFET drain-to-source current with gate shorted to source $V_{TB}$=BJT thermal voltage ($\approx$25 millivolts at 25° C.)

Figure 8:
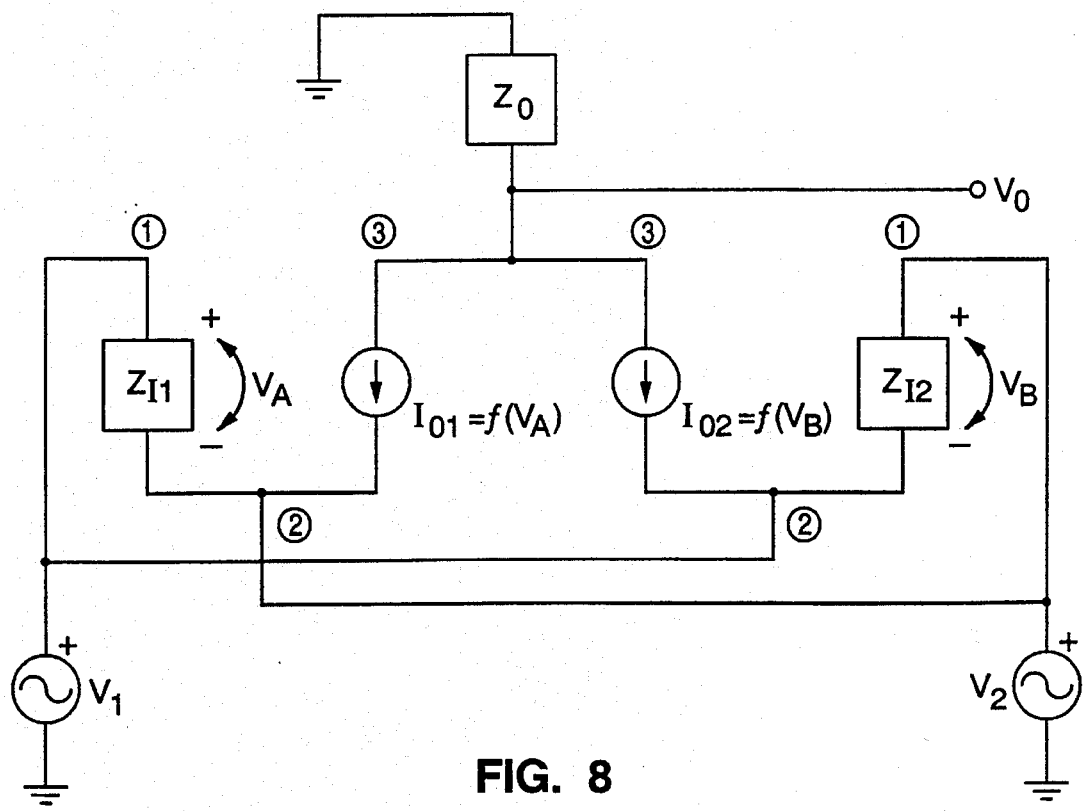
FIG. 8 illustrates the circuit model of FIG. 5 using the transistor model of FIG. 7.

$V_{TM}$=MOSFET threshold voltage
$V_{TJ}$=JFET pinch-off voltage
$V_{PM}$=MESFET pinch-off voltage
B=MOSFET conduction constant $\approx \mu C_{OX} W/(2L)$
$\mu$=MOSFET channel mobility
$C_{OX}$=MOSFET gate oxide capacitance (farads)
W=MOSFET channel width in microns
L=MOSFET channel length in microns Referring to FIG. 8, using the generalized transistor model of FIG. 7 in the mixer model of FIG. 5, a general expression for the output voltage $V_O$ can be found as follows:

$$V_O = -Z_0[f(V_A) + f(V_B)]$$
$$= -Z_0[f(V_1 - V_2) + f(V_2 - V_1)]$$

Expanding $f(V_A) + f(V_B)$:

$$f(V_A) = a_0 + a_1 V_A^2 + a_3 V_A^3 + a_4 V_A^4 \ldots$$

$$f(V_B) = b_0 + b_1 V_B^2 + b_3 V_B^3 + b_4 V_B^4 \ldots$$

where:
$a_0$="0th" scalar coefficient
$b_0$="0th" scalar coefficient
$a_m$="mth" scalar coefficient
$b_m$="mth" scalar coefficient
$m \in \{1, 2, 3, 4, \ldots\}$ Accordingly:

$$V_O = -Z_0 \cdot \begin{bmatrix} a_0 + a_1(V_1 - V_2) + a_2(V_1 - V_2)^2 + \\ a_3(V_1 - V_2)^3 + a_4(V_1 - V_2)^4 + \ldots + \\ b_0 + b_1(V_2 - V_1) + b_2(V_2 - V_1)^2 + \\ b_3(V_2 - V_1)^3 + b_4(V_2 - V_1)^4 + \ldots \end{bmatrix}$$

$$= -Z_0 \cdot \begin{bmatrix} a_0 + a_1(V_1 - V_2) + a_2(V_1 - V_2)^2 + \\ a_3(V_1 - V_2)^3 + a_4(V_1 - V_2)^4 + \ldots + \\ b_0 - b_1(V_1 - V_2) + b_2(V_1 - V_2)^2 - \\ b_3(V_1 - V_2)^3 + b_4(V_1 - V_2)^4 + \ldots \end{bmatrix}$$

$$= -Z_0 \cdot \begin{bmatrix} (a_0 + b_0) + (a_1 - b_1)(V_1 - V_2) + \\ (a_2 + b_2)(V_1 - V_2)^2 + \\ (a_3 - b_3)(V_1 - V_2)^3 + \\ (a_4 + b_4)(V_1 - V_2)^4 + \ldots \end{bmatrix}$$

Assuming $a_n \approx b_n$, where $n \in \{0, 1, 2, \ldots\}$:

$$V_O \approx -Z_0 [2a_0 + 2a_2(V_1 - V_2)^2 + 2a_4(V_1 - V_2)^4 + \ldots]$$

Hence, from the foregoing it can be seen that while a dc term and the even-order terms, e.g. the even harmonics, of the mixing products of the input signals remain, the odd-order terms of the mixing products of the input signals are virtually eliminated. However, even if it cannot be assumed that $a_n \approx b_n$, the odd order terms will nonetheless be substantially suppressed relative to the even order terms since their scalar coefficients will be substantially less, i.e. $|a_n - b_n| \ll |a_n + b_n|$.

From the foregoing it can be further seen that if the two input signals have the same fundamental frequency, then a mixer in accordance with the present invention can be used as frequency doubler. In other words, since virtually only the even order terms of the mixing products of the input signals are produced and the second-order term is significant in magnitude compared to the fourth-order and higher terms, then with equal-frequency inputs, the present mixer can function well as a frequency doubler.

Figure 9:
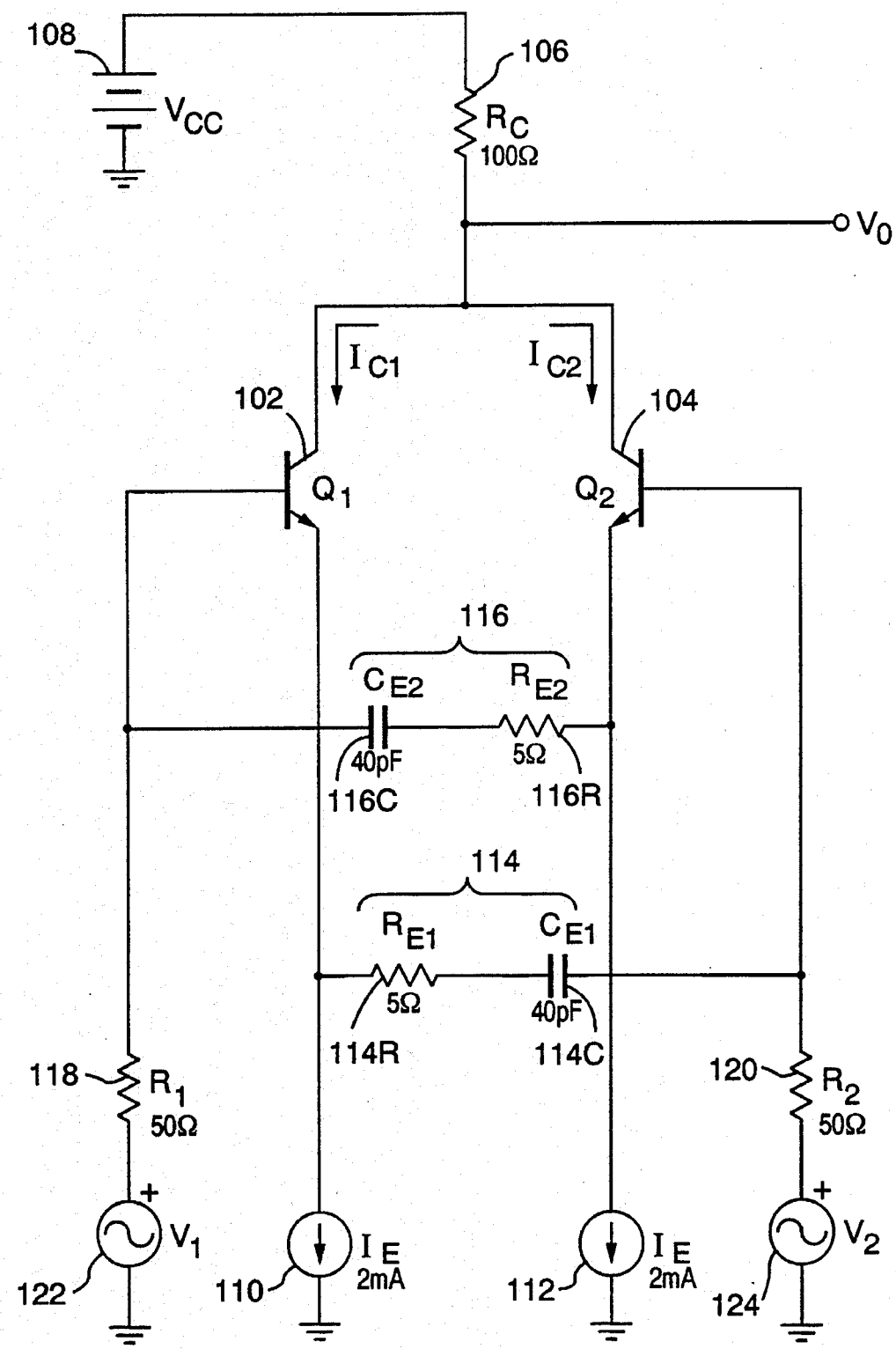
FIG. 9 is a schematic diagram of a preferred embodiment of a mixer in accordance with the present invention.

Referring to FIG. 9, a preferred embodiment of a mixer in accordance with the present invention includes two BJTs 102 ("$Q_1$"), 104 ("$Q_2$"), with mutually coupled collectors connected to a resistor 106 ("$R_C$"). The emitter of the first transistor $Q_1$ is coupled to the base of the second transistor $Q_2$ via a serial impedance 114 consisting of a resistor 114R ("$R_{E1}$") and capacitor 114C ("$C_{E1}$"). The emitter of the second transistor $Q_2$ is coupled to the base of the first transistor $Q_1$ via a serial impedance 116 consisting of a resistor 116R ("$R_{E2}$") and capacitor 116C ("$C_{E2}$"). The transistors $Q_1$ and $Q_2$ are biased at their collectors by a dc voltage source 108 via their shared collector resistor $R_C$, and at their respective emitters by dc current sources 110, 112. The transistors $Q_1$ and $Q_2$ are matched to each other, as are the passive components, i.e. resistors $R_{E1}$ and $R_{E2}$, and capacitors $C_{E1}$ and $C_{E2}$. The dc current sources 110, 112 provide equal emitter bias currents $I_E$ to the transistors $Q_1$ and $Q_2$. The capacitors $C_{E1}$ and $C_{E2}$ provide dc isolation between the base and emitter circuits of the transistors $Q_1$ and $Q_2$. Preferred values for the dc bias voltage $V_{CC}$ and currents $I_E$, and for the passive components $R_1$, $R_2$, $R_C$, $R_{E1}$, $R_{E2}$, $C_{E1}$ and $C_{E2}$ are as indicated in FIG. 9.

One ac input signal $V_1$ is applied, via a resistor 118 ["$R_1$"] (e.g. the internal, or source, resistance of the first ac signal source 122), to the base of the first transistor $Q_1$ and to the emitter of the second transistor $Q_1$ via the serial coupling impedance 116. A second ac input signal $V_1$ is applied, via a resistor 120 ["$R_2$"] (e.g. the internal, or source, resistance of the second ac signal source 124), to the base of the second transistor $Q_2$ and to the emitter of the first transistor $Q_1$ via the serial impedance 114. With the dc bias signals $V_{CC}$ and $I_E$, and the ac input signals $V_1$ and $V_2$ applied as shown, collector currents $I_{C1}$ and $I_{C2}$ for the transistors $Q_1$ and $Q_2$, respectively, are generated. These collector currents $I_{C1}$ and $I_{C2}$ are produced from the mixing of currents within transistors $Q_1$ and $Q_2$, respectively, which are induced from the applications of input signals $V_1$ and $V_2$. These collector currents $I_{C1}$ and $I_{C2}$ combine in the collector resistor $R_C$. The resulting ac signal voltage produced across the collector resistor $R_C$ constitutes the output signal $V_O$.

Figure 10:
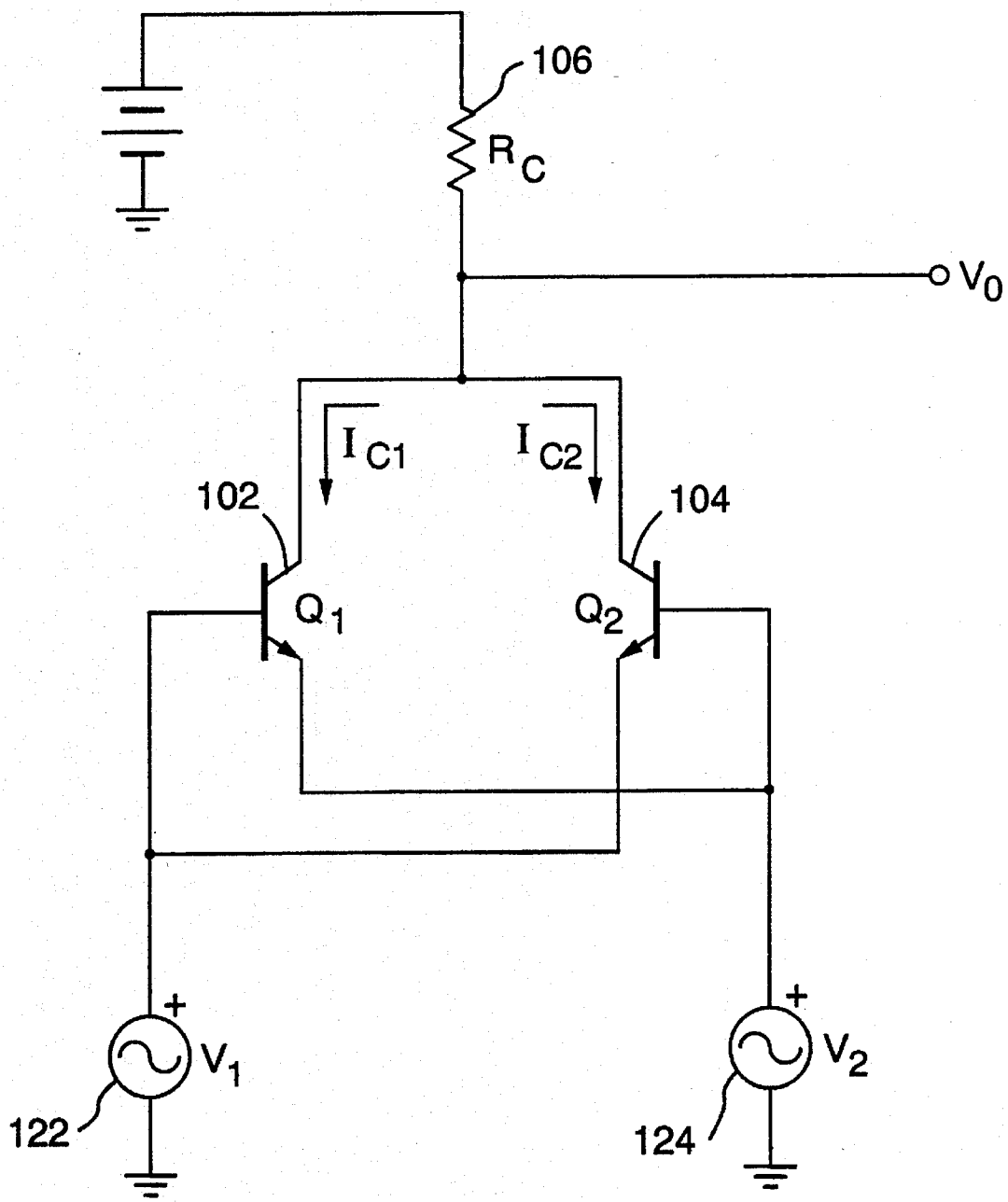
FIG. 10 is a schematic diagram for the ac signal model of the mixer of FIG. 9.

Referring to FIG. 10, wherein the ac signal model for the mixer circuit 100 of FIG. 9 is shown, and in accordance with the foregoing discussion, the ac output signal $V_O$ is generated substantially in accordance with the following:

$$V_O = -R_C \cdot (I_{C1} + I_{C2})$$
$$= -R_C I_S \cdot \{\exp[(V_{BEO} + V_1 - V_2)/V_T] + \exp[(V_{BEO} - V_1 + V_2)/V_T]\}$$
$$= -R_C I_S \cdot \exp[V_{BEO}/V_T] \cdot \{\exp[(V_1 - V_2)/V_T] + \exp[(V_2 - V_1)/V_T]\}$$
$$= -R_C I_S \cdot \exp[V_{BEO}/V_T] \cdot 2\cosh[(V_1 - V_2)/V_T]$$
$$= -2I_E R_C \cdot \left[1 + \frac{(V_1 - V_2)^2}{2! \cdot V_T^2} + \frac{(V_1 - V_2)^4}{4! \cdot V_T^4} + \frac{(V_1 - V_2)^6}{6! \cdot V_T^6} + \ldots\right]$$
$$\approx -2I_E R_C \cdot \cosh[(V_1 - V_2)/V_T]$$

where:
$R_C$=collector resistor value in ohms $I_{C1}$=Q1 collector current in amperes $I_{C2}$=Q2 collector current in amperes $I_S$=BJT saturation current in amperes $I_E$=emitter current in amperes $V_{BE0}$32 base-emitter dc junction voltage $V_1$=carrier ("LO") signal voltage $=|V_1|.\cos(2\pi f_1 t)$ $V_2$=modulating ("RF") signal voltage $=|V_2|.\cos(2\pi f_2 t)$ $V_T$=transistor base-emitter junction forward bias threshold voltage ($\approx$25 millivolts at 25° C.)

$f_1$=frequency of carrier signal $f_2$=frequency of modulating signal t=time in seconds $\exp[x]=e^x$ $\cosh[x]$=hyperbolic cosine function of "x"

From the foregoing it can be seen that the frequency spectrum of the output signal $V_O$ includes even order terms and substantially suppressed odd order terms of the mixing products of the input signals $V_1$ and $V_2$. (The even order terms include $Af_1+Bf_2$, $Bf_1+Af_2$, $|Af_1-Bf_2|$, and $|Bf_1-Af_2|$, and the odd order terms include $Cf_1+Df_2$, $Df_1+Cf_2$, $|Cf_1-Df_2|$ and $|Df_1-Cf_2|$, where $(A+B)\in\{2, 4, 6, \ldots\}$ and $(C+D)\in\{1, 3, 5, \ldots\}$.) Further, it should be appreciated that this limited frequency content in the output signal $V_O$ has been achieved without the need for discrete reactive components, such as capacitors or inductors, or tuned elements, such as transmission line elements (e.g. open or shorted stubs), which are typically used to perform filtering functions (e.g. highpass, lowpass, bandpass or bandstop).

A mixer in accordance with the present invention has several additional advantages, such as good noise performance, low distortion and the ability to operate at low quiescent currents and with a low dc bias voltage (e.g. three volts and below). Further, a mixer in accordance with the present invention provides conversion gain and has a design structure well suited to monolithic silicon integration techniques, particularly since only one type of active device (e.g. NPN BJT) is needed. One drawback of the mixer of FIG. 9 is a relatively low isolation between the two input signals $V_1$ and $V_2$.

Exemplary comparisons of several operating characteristics between a mixer in accordance with the present invention and a conventional Gilbert multiplier mixer are shown below in Table 1:

TABLE 1

COMPARISON OF CONVENTIONAL MIXERS WITH EVEN ORDER TERM MIXER

| Mixer Type | Gilbert Mult. Vcc = 5V, | Gilbert Mult. Vcc = 3V, | Even Order Vcc = 3V | |
|---|---|---|---|---|
| Parameter | Zo = 50 Ohms | Zo = 200 Ohms | Zo = 200 Ohms | Unit |
| Noise Figure | 17 | 9.4 | 5 | dB |
| Conversion Gain | 1.8 | 0.9 | 2.4 | dB |
| Output Level ("P1dB") | 0.29 | 0.63 | 0.53 | Vpp |
| Supply Current | 8.1 | 6.3 | 5 | mA |
| LO-to-RF Rejection | $\approx$30 | $\approx$30 | $\approx$6 | dB |

Figure 11:
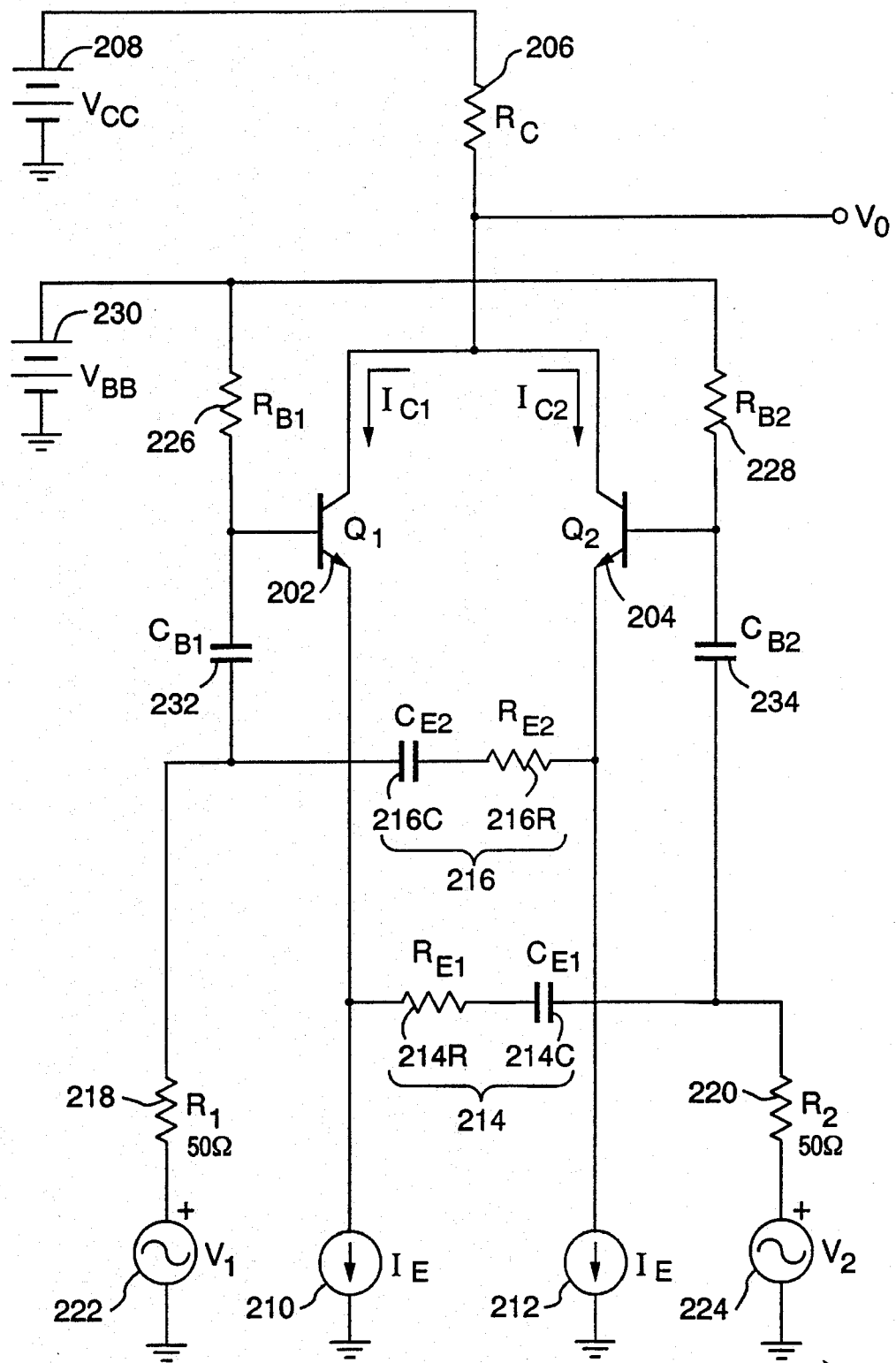
FIG. 11 is a schematic diagram of an alternative preferred embodiment of a mixer in accordance with the present invention.

Referring to FIG. 11, an alternative preferred embodiment of a mixer in accordance with the present invention includes active and passive components interconnected substantially as discussed above and shown in FIG. 9, with the addition of some passive elements 226 ("$R_{B1}$"), 232 ("$C_{B1}$"), 228 ("$R_{B2}$"), 234 ("$C_{B2}$") in the base circuits of the transistors 202 ("$Q_1$"), 204 ("$Q_2$"), and a dc base biasing voltage $V_{BB}$, as shown.

The second dc voltage source 230 applies a dc bias voltage $V_{BB}$ via base resistors $R_{B1}$ and $R_{B2}$ to the bases of the transistors $Q_1$ and $Q_2$. The first ac input signal $V_1$, via the series resistor 218 ("$R_1$"), is coupled to the base of the first transistor $Q_1$ via a series coupling capacitor 232 ("$C_{B1}$"). The second ac input signal $V_2$, via the series resistor 220 ("$R_2$" is coupled to the base of the second transistor $Q_2$ via a series coupling capacitor 234 ("$C_{B2}$").

Figure 12:
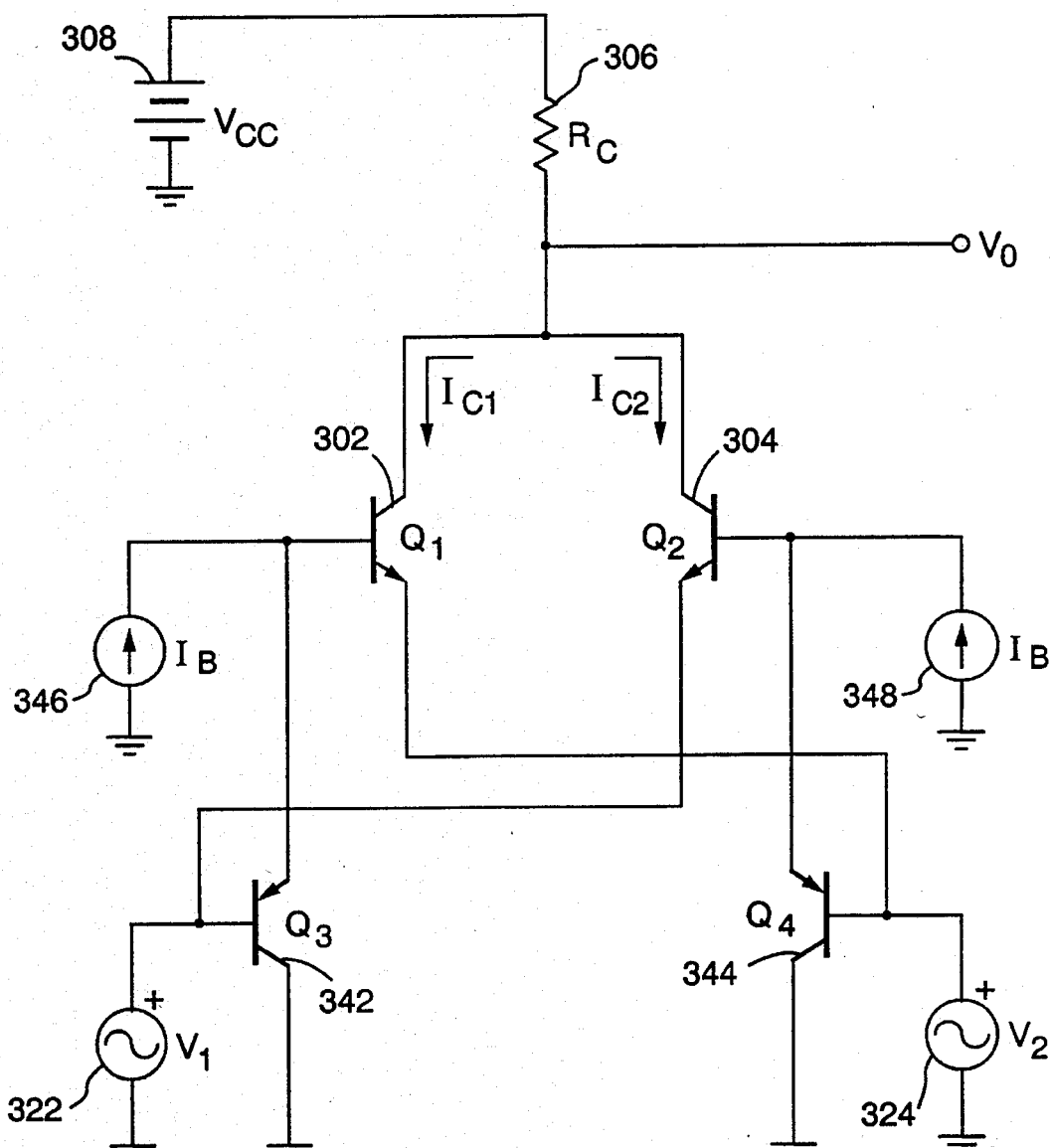
FIG. 12 is a schematic diagram of another alternative preferred embodiment of a mixer in accordance with the present invention.

Referring to FIG. 12, another alternative preferred embodiment of a mixer in accordance with the present invention includes two NPN BJTs 302 ("$Q_1$"), 304 ("$Q_2$"), two PNP BJTs 342 ("$Q_3$"), 344 ("$Q_4$") and a collector resistor 306 ("$R_C$"), connected substantially as shown. A dc voltage source 308 applies a dc bias voltage $V_{CC}$, via the resistor $R_C$, to the collectors of transistors $Q_1$ and $Q_2$. The base and emitter of transistor $Q_1$ are coupled to the emitter of transistor $Q_3$ and base of transistor $Q_4$, respectively. The base and emitter of transistor $Q_2$ are coupled to the emitter of transistor $Q_4$ and base of transistor $Q_3$, respectively. The collectors of transistors $Q_3$ and $Q_4$ are grounded. The dc current sources 346, 348 apply equal dc bias currents $I_B$ to the nodes which couple the base and emitter of transistors $Q_1$ and $Q_3$, and the base and emitter of transistors $Q_2$ and $Q_4$, respectively.

The first ac input signal $V_1$ (e.g. LO) is applied to the base of transistor $Q_3$ and emitter of transistor $Q_2$. The second ac input signal $V_2$ (e.g. RF) is applied to the base of transistor $Q_4$ and emitter of transistor $Q_1$. In accordance with the foregoing discussion regarding the mixer circuits of FIGS. 9 and 11, collector currents $I_{C1}$ and $I_{C2}$ are produced, which in turn combine in resistor $R_C$ and produce the output signal voltage $V_O$ substantially in accordance with the following:

$$V_O \approx -2KI_B R_C \cdot \cosh[(V_1-V_2)/V_T]$$

where:

$V_O$=output signal (volts)

$I_B$=base bias current (amperes)

$R_C$=collectors' output resistor (ohms)

$V_1$ =carrier ("LO") signal (volts) $=|V_1|.\cos(2\pi f_1 t)$ $V_2$=modulating ("RF") signal (volts) $=|V_2|.\cos(2\pi f_1 t)$ $V_T$=transistor base-emitter junction forward bias threshold voltage ($\approx$25 millivolts at 25° C.)

$f_1$=frequency of carrier signal (Hz)

$f_2$=frequency of modulating signal (Hz)

t=time (seconds)

K=constant relating collector currents $=I_{SN}/I_{SP} \approx (I_{CN}/I_{CP}).\exp[(V_{BEP}-V_{BEN})/V_T]$ $I_{SN}$=NPN BJT saturation current (amperes)

$I_{SP}$=PNP BJT saturation current (amperes)

$I_{CN}$=NPN BJT collector current (amperes)

$I_{CP}$=PNP BJT collector current (amperes)

$V_{BEP}$=PNP BJT base-emitter voltage $V_{BEN}$=NPN BJT base-emitter voltage $\exp[x]=e^x$ $\cosh[x]$=hyperbolic cosine function of "x"

Referring to FIG. 13, an exemplary frequency spectrum of the output signal $V_O$ is illustrated. In accordance with the foregoing discussion, the $V_O$ frequency spectrum includes even order terms and suppressed odd order terms (e.g.

<-40dB) of the mixing products of the input signals $V_1$ and $V_2$. (The even order terms include $Af_1+Bf_2$, $Bf_1+Af_2$, $|Af_1-Bf_2|$ and $|Bf_1-Af_2|$, and the odd order terms include $Cf_1+Df_2$, $Df_1+Cf_2$, $|Cf_1-Df_2|$ and $|Df_1-Cf_2|$, where $(A+B)\in\{2, 4, 6, \ldots\}$ and $(C+D)\in\{1, 3, 5, \ldots\}$.)

The exemplary output signal $V_O$ frequency spectrum of FIG. 13 was computed in accordance with the discussion above for the preferred embodiment of FIGS. 9 and 10 as follows:

$$V_O = -2I_E R_C \cdot \cosh[(V_1-V_2)/V_T]$$
$$= (0.5) \cdot \cosh\left[\frac{0.03162 \cdot \cos(2\pi f_1 t) - 0.01 \cdot \cos(2\pi f_2 t)}{0.0259}\right]$$

where:
 0.03162≡−20 dBm in a 50-ohm system
 0.01≡−30 dBm in a 50-ohm system
 $f_1$=1 gigahertz=1×10$^9$ Hz
 $f_2$=900 megahertz=900×10$^6$ Hz The relative amplitudes for the even order terms (in decibels ["dB"] relative to the second order term $|f_1-f_2|$) shown in FIG. 13 are listed below in Table 2. (The odd order terms are at least 40 dB down from the second order term $|f_1-f_2|$.)

TABLE 2

| Term | Order | Amplitude (dB) |
|---|---|---|
| $|f_1-f_2|$ | 2 | 0 |
| $2|f_1-f_2|$ | 4 | −31.2 |
| $2f_2$ | 2 | −14.7 |
| $|f_1+f_2|$ | 2 | 0 |
| $2f_1$ | 2 | +3.6 |
| $3f_1-f_2$ | 4 | −24.9 |
| $2|f_1+f_2|$ | 4 | −31.2 |
| $3f_1+f_2$ | 4 | −24.9 |
| $4f_1$ | 4 | −26.9 |

A mixer having a circuit topology in accordance with the foregoing preferred embodiments of the present invention advantageously has input signal ports with input impedances which closely approximate the typical characteristic impedances of most video, RF and microwave signal systems. Accordingly, such a mixer interfaces well with typical, standard video, RF and microwave circuits, equipment and instruments. This can be better understood while referring to FIGS. 14A–14C during the following discussion.

A typical BJT exhibits a base terminal impedance of several hundred ohms when operated in a common emitter configuration with a few milliamperes of collector bias current. This impedance is too high for efficient power transfer into the base terminal in typical 50-ohm or 75-ohm video, RF or microwave signal systems.

Figure 14A:
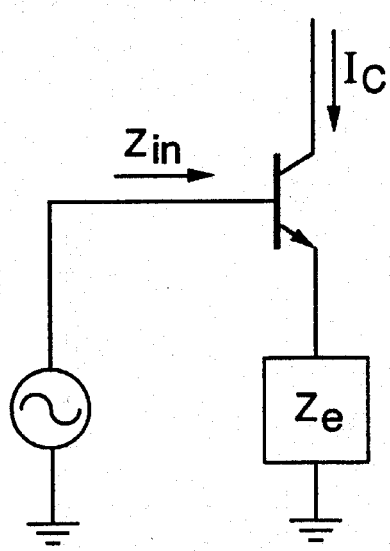
FIG. 14A illustrates a circuit model used in computing the input impedance of a common emitter amplifier.

Referring to FIG. 14A, a common circuit model used when analyzing the input impedance of a common emitter amplifier is illustrated. Based upon this model, the input impedance $Z_{in}$ can be computed as follows:

$$Z_{in}=\beta(r_e+Z_e)=\beta(V_T/I_C+Z_e)$$

where:
 $\beta$=common emitter current gain =$f(\Omega)$=$f(2\pi f)$
 $r_e$=intrinsic emitter resistance
 $Z_e$=emitter circuit impedance
 $V_T$=base-emitter junction forward bias threshold voltage
 $I_C$=collector current Assuming that $\beta$=50, $V_T$=0.0259 volts, $I_C$=2 mA and $Z_e$=0 (typical exemplary operating conditions), then:

$$Z_{in} = \beta(V_T/I_C+Z_e) = 50(0.0259/0.002+0)$$
$$\approx 648 \text{ ohms}$$

As can be seen from the foregoing, the input impedance for a common emitter amplifier operating under typical conditions is much higher than 50 ohms, and therefore provides a poor match for a 50-ohm signal source. At higher frequencies, the transistor current gain $\beta$ [which is a function of frequency, i.e. $\beta=f(\Omega)=f(2\pi f)$] decreases and acquires a phase lag. Accordingly, although the input impedance may therefore be reduced at higher frequencies, the current phase lag introduced by $\beta$ causes the input of the amplifier to appear capacitive. This causes the amplifier to continue to present a poor match to a 50-ohm signal source.

On the other hand, when operated in a common base configuration with a few milliamperes of collector bias current, a typical BJT exhibits an emitter terminal impedance on the order of a few ohms. This impedance is too low for efficient power transfer from a 50- or 75-ohm signal source.

Figure 14B:
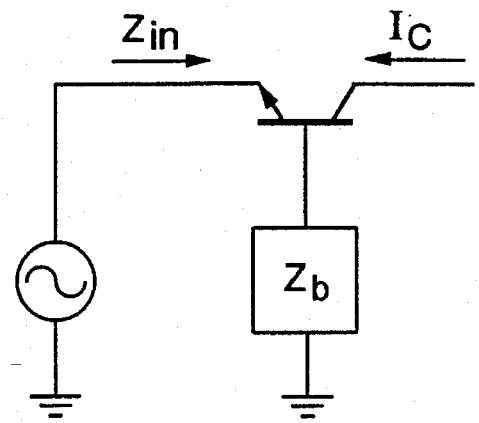
FIG. 14B illustrates a circuit model used in computing the input impedance of a common base amplifier.

Referring to FIG. 14B, a common circuit model used when analyzing the input impedance of a common base amplifier is illustrated. Based upon this model, the input impedance $Z_{in}$ can be computed as follows:

$$Z_{in}=(1/g_m+Z_b/\beta)=(V_T/I_C+Z_b/\beta)$$

where:
 $g_m$=transistor transconductance
 $Z_b$=base circuit impedance

Assuming that $V_T$=0.0259 volts, $I_C$=2 mA, $Z_b$=0 and $\beta$=50 (typical exemplary operating conditions), then:

$$Z_{in} = (V_T/I_C+Z_b/\beta) = (0.0259/0.002+0/50)$$
$$\approx 12.9 \text{ ohms}$$

From the foregoing it can be seen that the input impedance for a common base amplifier operating under typical conditions is much lower than 50 ohms, and is therefore also a poor match for a 50-ohm signal source. Quite often the input impedance rises at higher frequencies due to combined effects of decreasing transistor current gain $\beta$ (as noted above) and the presence of a parasitic ohmic base resistance. Because of the phase lag associated with $\beta$ (as also noted above), the rising input impedance appears inductive. Thus, the input impedance continues to present a poor match to a 50-ohm signal source.

However, for a mixer topology in accordance with the present invention, when operated at a few milliamperes of bias current, the input terminal impedance is quite close to the typical characteristic impedances of most video, RF and microwave signal systems.

Figure 14C:
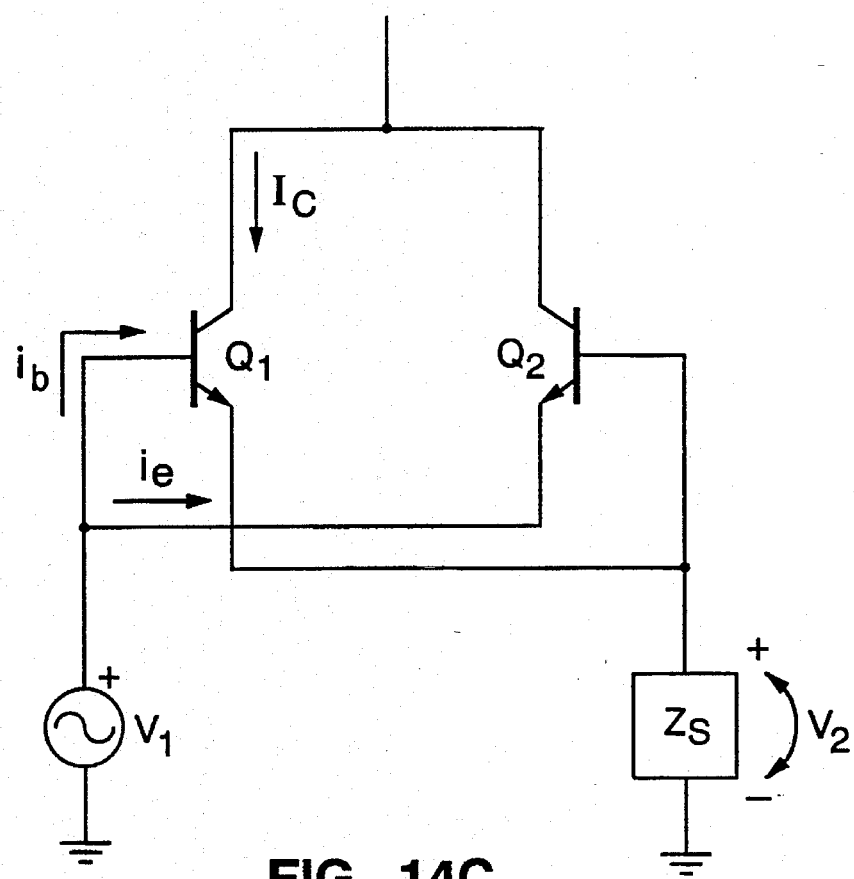
FIG. 14C illustrates a circuit model used in computing the input impedance of a portion of a mixer in accordance with the present invention.

Referring to FIG. 14C, the input impedance of a mixer in accordance with a preferred embodiment of the present invention (e.g. as shown in FIG. 9) can be computed as follows:

$$Z_{in} = \frac{V_{in}}{I_{in}} = \frac{V_1}{i_b + i_e}$$

$$= \frac{V_1}{\frac{V_1}{\beta(r_e + Z_s)} + \frac{V_1}{(r_e + Z_s)}}$$

$$= \frac{r_e + Z_s}{1 + 1/\beta}$$

$$= \frac{V_T/I_c + Z_s}{1 + 1/\beta}$$

Assuming that $V_T$=0.0259 volts, $I_C$=2 mA, $Z_S$=50 and $\beta$=50 (typical exemplary operating conditions), then:

$$Z_{in} = \frac{V_T/I_c + Z_s}{1 + 1/\beta}$$

$$= \frac{0.0259/0.002 + 50}{1 + 1/50}$$

$$\approx 61.7 \text{ ohms}$$

From the foregoing it can be seen that the input impedance of a mixer in accordance with the present invention is close to the typical 50-ohm impedance of a signal source that is driving the other input. Hence, with both inputs driven by such sources, the input impedance of either input becomes approximately 62 ohms. This represents a standing wave ratio ("SWR") of 1.23:1 in a 50-ohm system. Hence, both signal sources are reasonably well matched.

This match is maintained at moderately high frequencies for two reasons. First, inductive impedance effects observed due to an increase in the intrinsic emitter resistance $r_e$ are reduced, since to affect the input impedance, $r_e$ must increase relative to the summation of it and the source impedance (i.e. $r_e+Z_s$) rather than just $r_e$, as for the common base amplifier. Second, a decrease in the transistor current gain $\beta$ has only a small effect on the input impedance and also partially cancels an increase in $r_e$ due to frequency-dependent $\beta$ decreasing at higher frequencies.

Various other modifications and alterations in the structure and method of operation of this invention will be apparent to those skilled in the art without departing from the scope and spirit of this invention. Although the invention has been described in connection with specific preferred embodiments, it should be understood that the invention as claimed should not be unduly limited to such a specific embodiments.

What is claimed is:

1. A signal mixer for receiving and mixing first and second ac input signals, and for providing an ac output signal with even order terms and substantially suppressed odd order terms of the mixing products of said first and second input signals, said signal mixer comprising:

first mixer means for receiving and mixing first and second ac input signals to provide a first ac mixed signal, wherein said first mixer means is de-biased in a first linear operating region and has a first input impedance associated therewith, and wherein said first and second ac input signals are received at opposing ends of said first input impedance;

second mixer means coupled to said first mixer means for receiving and mixing said first and second ac input signals to provide a second ac mixed signal, wherein said second mixer means is de-biased in a second linear operating region and has a second input impedance associated therewith, and wherein said first and second ac input signals are received at opposing ends of said second input impedance; and combiner means coupled to said first and second mixer means for receiving and combining said first and second ac mixed signals to provide an ac output signal, wherein said ac output signal includes a first plurality of even order terms and a second plurality of odd order terms of mixing products of said first and second ac input signals, and further wherein each of said first plurality of even order terms is greater in magnitude than adjacent ones of said second plurality of odd order terms.

2. A signal mixer as recited in claim 1, wherein said first mixer means comprises:

a first serial impedance; and a first transistor which includes a first terminal for receiving at least part of said first ac input signal, a second terminal coupled to said first serial impedance for receiving said second ac input signal, and a third terminal for providing said first ac mixed signal.

3. A signal mixer as recited in claim 2, wherein said second mixer means comprises:

a second serial impedance; and a second transistor which includes a first terminal for receiving at least part of said second ac input signal, a second terminal coupled to said second serial impedance for receiving said first ac input signal, and a third terminal for providing said second ac mixed signal.

4. A signal mixer as recited in claim 1, wherein said combiner means comprises a resistor coupled to said first and second mixer means, said first and second ac mixed signals comprise first and second ac electrical currents, respectively, through said resistor and said ac output signal comprises an ac voltage.

5. A signal mixer for receiving and mixing first and second ac input signals, and for providing an ac output signal with even order terms and substantially suppressed odd order terms of the mixing products of said first and second input signals, said signal mixer comprising:

a first transistor circuit which includes a first transistor which is dc-biased in a first linear operating region and has associated therewith a first input impedance with first and second opposing ends, a primary input circuit connected to said first end of said first input impedance for receiving a first ac input signal, a secondary input circuit connected to said second end of said first input impedance for receiving a first dc signal and at least part of a second ac input signal, and an output for providing a first ac mixed signal;

a second transistor circuit which includes a second transistor which is dc-biased in a second linear operating region and has associated therewith a second input impedance with first and second opposing ends, a primary input circuit connected to said first end of said second input impedance for receiving said second ac input signal, a secondary input circuit connected to said second end of said second input impedance for receiving a second dc signal and at least part of said first ac input signal, and an output for providing a second ac mixed signal, wherein said second transistor circuit output is coupled to said first transistor circuit output; and a resistor coupled to said first and second transistor circuit outputs to receive said first and second ac mixed signals and to provide an ac output signal, wherein said ac output signal includes a first plurality of even order terms and a second plurality of odd order terms of mixing products of said first and second ac input signals, and further wherein each of said first plurality of even order terms is greater in magnitude than adjacent ones of said second plurality of odd order terms.

6. A signal mixer as recited in claim 5, wherein said first transistor secondary input circuit comprises a transistor terminal and a coupling impedance connected thereto for coupling thereto said received at least part of said second ac input signal.

7. A signal mixer as recited in claim 6, wherein said second transistor secondary input circuit comprises a transistor terminal and a coupling impedance connected thereto for coupling thereto said received at least part of said first ac input signal.

8. A signal mixer for receiving and mixing first and second ac input signals, and for providing an ac output signal with even order terms and substantially suppressed odd order terms of the mixing products of said first and second input signals, said signal mixer comprising:

a first transistor which includes a primary terminal for receiving a first dc signal, a secondary terminal for receiving a first ac input signal, and a tertiary terminal for providing a first ac mixed signal;

a second transistor which includes a primary terminal for receiving a second dc signal, a secondary terminal for receiving a second ac input signal, and a tertiary terminal for providing a second ac mixed signal, wherein said tertiary terminal of said second transistor is coupled to said tertiary terminal of said first transistor;

a third transistor which includes a primary terminal coupled to said secondary terminal of said second transistor, a secondary terminal coupled to said primary terminal of said first transistor, and a tertiary terminal;

a fourth transistor which includes a primary terminal coupled to said secondary terminal of said first transistor, a secondary terminal coupled to said primary terminal of said second transistor, and a tertiary terminal; and a resistor coupled to said tertiary terminals of said first and second transistors to receive said first and second ac mixed signals and to provide an ac output signal, wherein said ac output signal includes a first plurality of even order terms and a second plurality of odd order terms of mixing products of said first and second ac input signals, and further wherein each of said first plurality of even order terms is greater in magnitude than adjacent ones of said second plurality of odd order terms.

9. A signal mixer as recited in claim 8, wherein said first, second, third and fourth transistors comprise first, second, third and fourth bipolar junction transistors, respectively, with each having associated therewith a base-emitter junction forward bias threshold voltage, and wherein each one of said first and second bipolar junction transistors has associated therewith a first base-emitter voltage, a base current and a first collector current, and further wherein each one of said third and fourth bipolar junction transistors has associated therewith a second base-emitter voltage and a second collector current, and still further wherein said ac output signal is provided approximately in accordance with:

$$V_0 = -2I_B R_C (I_{CN}/I_{CP}) \cdot \exp[(V_{BEP} - V_{BEN}) V_1 - V_2)/V_T]$$

where:

$V_0$=voltage value of said ac output signal
$I_B$=value of said base current
$R_C$=resistance value of said resistor
$V_1$=voltage value of said first ac input signal
$V_2$=voltage value of said first ac input signal
$V_T$=value of said base-emitter junction forward bias threshold voltage
$I_{CN}$=value of said first collector current
$I_{CP}$=value of said second collector current
$V_{BEP}$=value of said second base-emitter voltage
$V_{BEN}$32 value of said first base-emitter voltage
$\exp[(V_{BEP} - V_{BEN})/V_T]$=exponential function of $(V_{BEP} - V_{BEN})/V_T$
$\cosh[(V_1 - V_2)/V_T]$=hyperbolic cosine function of $[(V_1 - V_2)/V_T]$.

10. A signal mixing method for receiving and mixing first and second ac input signals, and for providing an ac output signal with even order terms and substantially suppressed odd order terms of the mixing products of said first and second input signals, said signal mixing method comprising the steps of:

inputting first and second ac input signals to opposing ends of an input impedance of a first signal mixer which is dc-biased in a first linear operating region;

mixing said first and second ac input signals in said first signal mixer to provide a first ac mixed signal;

inputting said first and second ac input signals to opposing ends of an input impedance of a second signal mixer which is dc-biased in a second linear operating region;

mixing said first and second ac input signals in said second signal mixer to provide a second ac mixed signal; and combining said first and second ac mixed signals to provide an ac output signal, wherein said ac output signal includes a first plurality of even order terms and a second plurality of odd order terms of mixing products of said first and second ac input signals, and further wherein each of said first plurality of even order terms is greater in magnitude than adjacent ones of said second plurality of odd order terms.

11. A signal mixing method as recited in claim 10, wherein said step of mixing said first and second ac input signals in said first signal mixer to provide a first ac mixed signal comprises:

inputting at least part of said first ac input signal to a first terminal of a first transistor;

inputting said second ac input signal to a first serial impedance coupled to a second terminal of said first transistor; and outputting said first ac mixed signal from a third terminal of said first transistor.

12. A signal mixing method as recited in claim 11, wherein said step of mixing said first and second ac input signals in said second signal mixer to provide a second ac mixed signal comprises:

inputting at least part of said second ac input signal to a fourth terminal of a second transistor;

inputting said first ac input signal to a second serial impedance coupled to a fifth terminal of said second transistor; and outputting said second ac mixed signal from a sixth terminal of said second transistor.

13. A signal mixing method as recited in claim 10, wherein said step of combining said first and second ac mixed signals to provide an ac output signal comprises:
  receiving first and second ac electrical currents as said first and second ac mixed signals, respectively;
  combining said first and second ac electrical currents in a resistor; and
  providing said ac output signal as an ac voltage across said resistor.

14. A signal mixing method for mixing first and second ac input signals, and for providing an ac output signal with even order terms and substantially suppressed odd order terms of the mixing products of said first and second input signals, said signal mixing method comprising the steps of:
  inputting a first ac input signal to a primary input circuit of a first transistor circuit which includes a first transistor which is dc-biased in a first linear operating region and has associated therewith a first input impedance with first and second opposing ends, wherein said first transistor primary input circuit is connected to said first end of said first input impedance;
  inputting a first dc signal and at least part of a second ac input signal to a secondary input circuit of said first transistor circuit, wherein said first transistor secondary input circuit is connected to said second end of said first input impedance;
  outputting a first ac mixed signal from an output of said first transistor circuit;
  inputting said second ac input signal to a primary input circuit of a second transistor circuit which includes a second transistor which is dc-biased in a second linear operating region and has associated therewith a second input impedance with first and second opposing ends, wherein said second transistor primary input circuit is connected to said first end of said second input impedance;
  inputting a second dc signal and at least part of said first ac input signal to a secondary input circuit of said second transistor circuit, wherein said second transistor secondary input circuit is connected to said second end of said second input impedance;
  outputting a second ac mixed signal from an output of said second transistor circuit;
  inputting said first and second ac mixed signals to a resistor; and
  outputting from said resistor an ac output signal which includes a first plurality of even order terms and a second plurality of odd order terms of mixing products of said first and second ac input signals, and further wherein each of said first plurality of even order terms is greater in magnitude than adjacent ones of said second plurality of odd order terms.

15. A signal mixing method as recited in claim 14, wherein said step of inputting a first dc signal and at least part of a second ac input signal to a secondary input circuit of said first transistor circuit comprises inputting said at least part of said second ac input signal to a coupling impedance which comprises a portion of said first transistor circuit.

16. A signal mixing method as recited in claim 15, wherein said step of inputting a second dc signal and at least part of said first ac input signal to a secondary input circuit of said second transistor circuit comprises inputting said at least part of said first ac input signal to a coupling impedance which comprises a portion of said second transistor circuit.

17. A signal mixing method for mixing first and second ac input signals, and for providing an ac output signal with even order terms and substantially suppressed odd order terms of the mixing products of said first and second input signals, said signal mixer comprising:
  inputting a first dc signal to a node connecting a primary terminal of a first transistor and a secondary terminal of a third transistor;
  inputting a first ac input signal to a secondary terminal of said first transistor and to a primary terminal of a fourth transistor;
  outputting a first ac mixed signal from a tertiary terminal of said first transistor;
  inputting a second dc signal to a node connecting a primary terminal of a second transistor and secondary terminal of said fourth transistor;
  inputting a second ac input signal to a secondary terminal of said second transistor and to a primary terminal of said third transistor;
  outputting a second ac mixed signal from a tertiary terminal of said second transistor;
  inputting said first and second ac mixed signals to a resistor; and
  outputting from said resistor an ac output signal which includes a first plurality of even order terms and a second plurality of odd order terms of mixing products of said first and second ac input signals, and further wherein each of said first plurality of even order terms is greater in magnitude than adjacent ones of said second plurality of odd order terms.

18. A signal mixing method as recited in claim 17, wherein said first, second, third and fourth transistors comprise first, second, third and fourth bipolar junction transistors, respectively, with each having associated therewith a base-emitter junction forward bias threshold voltage, and wherein each one of said first and second bipolar junction transistors has associated therewith a first base-emitter voltage, a base current and a first collector current, and further wherein each one of said third and fourth bipolar junction transistors has associated therewith a second base-emitter voltage and a second collector current, and still further wherein said step of outputting an ac output signal comprises outputting said ac output signal approximately in accordance with:

$$V_0 \approx -2I_B R_C (I_{CN}/I_{CP}) \cdot \exp[(V_{BEP}-V_{BEN})/V_T] \cdot \cosh[(V_1-V_2)/V_T]$$

where:
  $V_0$=voltage value of said ac output signal
  $I_B$=value of said base current
  $R_C$=resistance value of said resistor
  $V_1$=voltage value of said first ac input signal
  $V_2$=voltage value of said first ac input signal
  $V_T$=value of said base-emitter junction forward bias threshold voltage
  $I_{CN}$=value of said first collector current
  $I_{CP}$=value of said second collector current
  $V_{BEP}$=value of said second base-emitter voltage
  $V_{BEN}$=value of said first base-emitter voltage
  $\exp[(V_{BEP}-V_{BEN})/V_T]$=exponential function of $(V_{BEP}-V_{BEN})/V_T$
  $\cosh[(V_1-V_2)/V_T]$=hyperbolic cosine function of $[(V_1-V_2)/V_T]$.

19. A signal mixer for receiving and mixing first and second ac input signals, and for providing an ac output signal with even order terms and substantially suppressed odd order terms of the mixing products of said first and second input signals, said signal mixer comprising:

first mixer means for receiving and mixing first and second ac input signals to provide a first ac mixed signal, wherein said first mixer means is dc-biased in a first linear operating region and includes:
- a first transistor with a primary terminal, a secondary terminal for receiving said second ac input signal and a tertiary terminal for providing said first ac mixed signal, and
- a second transistor with a primary terminal for receiving said first ac input signal, a secondary terminal coupled to said first transistor primary terminal and a tertiary terminal;

second mixer means coupled to said first mixer means for receiving and mixing said first and second ac input signals to provide a second ac mixed signal, wherein said second mixer means is dc-biased in a second linear operating region; and combiner means coupled to said first and second mixer means for receiving and combining said first and second ac mixed signals to provide an ac output signal, wherein said ac output signal includes a first plurality of even order terms and a second plurality of odd order terms of mixing products of said first and second ac input signals, and further wherein each of said first plurality of even order terms is greater in magnitude than adjacent ones of said second plurality of odd order terms.

20. A signal mixer as recited in claim 19, wherein said second mixer means comprises:

a third transistor including a primary terminal, a secondary terminal for receiving said first ac input signal, and a tertiary terminal for providing said second ac mixed signal; and a fourth transistor including a primary terminal for receiving said second ac input signal, a secondary terminal coupled to said third transistor primary terminal, and a tertiary terminal.

21. A signal mixer for receiving and mixing first and second ac input signals, and for providing an ac output signal with even order terms and substantially suppressed odd order terms of the mixing products of said first and second input signals, said signal mixer comprising:

a first transistor circuit which is dc-biased in a first linear operating region and includes a primary input circuit for receiving a first ac input signal, a secondary input circuit for receiving a first dc signal and at least part of a second ac input signal, and an output for providing a first ac mixed signal;

a second transistor circuit which is dc-biased in a second linear operating region and includes a primary input circuit for receiving said second ac input signal, a secondary input circuit for receiving a second dc signal and at least part of said first ac input signal, and an output for providing a second ac mixed signal, wherein said second transistor circuit output is coupled to said first transistor circuit output; and a resistor coupled to said first and second transistor circuit outputs to receive said first and second ac mixed signals and to provide an ac output signal, wherein said ac output signal includes a first plurality of even order terms and a second plurality of odd order terms of mixing products of said first and second ac input signals, and further wherein each of said first plurality of even order terms is greater in magnitude than adjacent ones of said second plurality of odd order terms;

wherein said first and second transistor circuits comprise first and second bipolar junction transistors, respectively, with each having a base-emitter junction forward bias threshold voltage associated therewith, and further wherein said ac output signal is provided approximately in accordance with:

$$V_0 \approx -2IR \cdot \cosh[(V_1-V_2)/V_T]$$

where:

$V_0$=voltage value of said ac output signal $I$=current value of each of said first and second dc signals $R$=resistance value of said resistor $V_1$=voltage value of said first ac input signal $V_2$=voltage value of said second ac input signal $V_T$=value of said base-emitter junction forward bias threshold voltage $\cosh[(V_1-V_2)/V_T]$=hyperbolic cosine of $(V_1-V_2)/V_T$.

22. A signal mixing method for receiving and mixing first and second ac input signals, and for providing an ac output signal with even order terms and substantially suppressed odd order terms of the mixing products of said first and second input signals, said signal mixing method comprising the steps of:

inputting first and second ac input signals to a first signal mixer which is dc-biased in a first linear operating region;

mixing said first and second ac input signals in said first signal mixer to provide a first ac mixed signal by:
- inputting said second ac input signal to a secondary terminal of a first transistor,
- inputting said first ac input signal to a primary terminal of a second transistor,
- coupling a first intermediate signal from a secondary terminal of said second transistor to a primary terminal of said first transistor, and
- outputting said first ac mixed signal from a tertiary terminal of said first transistor;

inputting said first and second ac input signals to a second signal mixer which is dc-biased in a second linear operating region;

mixing said first and second ac input signals in said second signal mixer to provide a second ac mixed signal; and combining said first and second ac mixed signals to provide an ac output signal, wherein said ac output signal includes a first plurality of even order terms and a second plurality of odd order terms of mixing products of said first and second ac input signals, and further wherein each of said first plurality of even order terms is greater in magnitude than adjacent ones of said second plurality of odd order terms.

23. A signal mixing method for mixing first and second ac input signals, and for providing an ac output signal with even order terms and substantially suppressed odd order terms of the mixing products of said first and second input signals, said signal mixing method comprising the steps of:

inputting a first ac input signal to a primary input circuit of a first transistor circuit which is dc-biased in a first linear operating region;

inputting a first dc signal and at least part of a second ac input signal to a secondary input circuit of said first transistor circuit;

outputting a first ac mixed signal from an output of said first transistor circuit;

inputting said second ac input signal to a primary input circuit of a second transistor circuit which is dc-biased in a second linear operating region;

inputting a second dc signal and at least part of said first ac input signal to a secondary input circuit of said second transistor circuit;

outputting a second ac mixed signal from an output of said second transistor circuit;

inputting said first and second ac mixed signals to a resistor; and outputting from said resistor an ac output signal which includes a first plurality of even order terms and a second plurality of odd order terms of mixing products of said first and second ac input signals, and further wherein each of said first plurality of even order terms is greater in magnitude than adjacent ones of said second plurality of odd order terms;

wherein said first and second transistor circuits comprise first and second bipolar junction transistors, respectively, with each having a base-emitter junction forward bias threshold voltage associated therewith, and further wherein said step of outputting an ac output signal comprises outputting said ac output signal approximately in accordance with:

$$V_0 \approx -2IR \cdot \cosh[(V_1-V_2)/V_T]$$

where:

$V_0$=voltage value of said ac output signal

I=current value of each of said first and second dc signals

R=resistance value of said resistor $V_1$=voltage value of said first ac input signal $V_2$=voltage value of said second ac input signal $V_T$=value of said base-emitter junction forward bias threshold voltage $\cosh[(V_1-V_2)/V_T]$=hyperbolic cosine of $(V_1-V_2)/V_T$.

24. A signal mixing method for receiving and mixing first and second ac input signals, and for providing an ac output signal with even order terms and substantially suppressed odd order terms of the mixing products of said first and second input signals, said signal mixing method comprising the steps of:

inputting first and second ac input signals to a first signal mixer which is dc-biased in a first linear operating region;

mixing said first and second ac input signals in said first signal mixer to provide a first ac mixed signal by:
inputting said second ac input signal to a secondary terminal of a first transistor,
inputting said first ac input signal to a primary terminal of a second transistor,
coupling a first intermediate signal from a secondary terminal of said second transistor to a primary terminal of said first transistor, and
outputting said first ac mixed signal from a tertiary terminal of said first transistor;

inputting said first and second ac input signals to a second signal mixer which is dc-biased in a second linear operating region;

mixing said first and second ac input signals in said second signal mixer to provide a second ac mixed signal by:
inputting said first ac input signal to a secondary terminal of a third transistor,
inputting said second ac input signal to a primary terminal of a fourth transistor,
coupling a second intermediate signal from a secondary terminal of said fourth transistor to a primary terminal of said third transistor, and
outputting said second ac mixed signal from a tertiary terminal of said third transistor;

combining said first and second ac mixed signals to provide an ac output signal, wherein said ac output signal includes a first plurality of even order terms and a second plurality of odd order terms of mixing products of said first and second ac input signals, and further wherein each of said first plurality of even order terms is greater in magnitude than adjacent ones of said second plurality of odd order terms.

* * * * *

UNITED STATES PATENT AND TRADEMARK OFFICE
CERTIFICATE OF CORRECTION

PATENT NO.  : 5,465,415
DATED       : November 7, 1995
INVENTOR(S) : David E. Bien It is certified that error appears in the above-indentified patent and that said Letters Patent is hereby corrected as shown below:

IN THE CLAIMS:

In Col. 11, line 57, please delete "de-biased" and replace with --dc-biased--.

In Col. 11, line 65, please delete "de-biased" and replace with --dc-biased--.

Signed and Sealed this

Twenty-fourth Day of June, 1997

Attest:

BRUCE LEHMAN

*Attesting Officer*    *Commissioner of Patents and Trademarks*

UNITED STATES PATENT AND TRADEMARK OFFICE
CERTIFICATE OF CORRECTION

PATENT NO. : 5,465,415
DATED : November 7, 1995
INVENTOR(S) : David E. Bien

It is certified that error appears in the above-identified patent and that said Letters Patent is hereby corrected as shown below:

Column 13,
Line 65, please delete "$V_0 \approx -2I_B R_C(I_{CN}/I_{CP}) \bullet \exp[(V_{BEP} - V_{BEN})V_1 - V_2)/V_T]$" and replace with -- $V_0 \approx -2I_B R_C(I_{CN}/I_{CP}) \bullet \exp[(V_{BEP} - V_{BEN})V_1 - V_2)/V_T] \bullet \cosh[(V_1 - V_2)/V_T]$ --.

Signed and Sealed this

Fourteenth Day of May, 2002

*Attest:*

*Attesting Officer*

JAMES E. ROGAN
*Director of the United States Patent and Trademark Office*